(12) United States Patent
Komatsuda et al.

(10) Patent No.: US 7,312,851 B2
(45) Date of Patent: Dec. 25, 2007

(54) PROJECTION OPTICAL SYSTEM, EXPOSURE APPARATUS, AND EXPOSURE METHOD IN WHICH A REFLECTIVE PROJECTION OPTICAL SYSTEM HAS A NON-CIRCULAR APERTURE STOP

(75) Inventors: Hideki Komatsuda, Kawasaki (JP); Tomowaki Takahashi, Yokohama (JP); Masayuki Suzuki, Utsunomiya (JP)

(73) Assignees: Nikon Corporation, Tokyo (JP); Canon Kabushiki Kaisha, Tokyo (JP)

( * ) Notice: Subject to any disclaimer, the term of this patent is extended or adjusted under 35 U.S.C. 154(b) by 11 days.

(21) Appl. No.: 11/158,096

(22) Filed: Jun. 22, 2005

(65) Prior Publication Data

US 2006/0012767 A1    Jan. 19, 2006

Related U.S. Application Data

(60) Provisional application No. 60/691,239, filed on Jun. 17, 2005.

(30) Foreign Application Priority Data

Jun. 23, 2004    (JP) .............................. 2004-184657

(51) Int. Cl.
G03B 27/54       (2006.01)
G03B 27/68       (2006.01)

(52) U.S. Cl. .......................................... 355/67; 355/52

(58) Field of Classification Search ................. 355/53, 355/67, 52; 359/650

See application file for complete search history.

(56) References Cited

U.S. PATENT DOCUMENTS

| 5,640,284 | A | 6/1997 | Tanitsu et al. |
| 6,069,937 | A | 5/2000 | Oshino et al. |
| 6,522,716 | B1 | 2/2003 | Murakami et al. |
| 6,750,948 | B2 | 6/2004 | Omura |
| 2003/0189696 | A1 | 10/2003 | Sumiyoshi et al. |
| 2004/0135984 | A1 | 7/2004 | Suzuki |

FOREIGN PATENT DOCUMENTS

| EP | 1 355 194 A2 | 10/2003 |
| EP | 1 418 467 A2 | 5/2004 |
| JP | A-10-335207 | 12/1998 |
| JP | A-2001-110709 | 4/2001 |
| JP | A-2001-185480 | 7/2001 |
| JP | A-2003-309057 | 10/2003 |
| JP | A-2004-158786 | 6/2004 |
| WO | WO 2004/046771 A1 | 6/2004 |

*Primary Examiner*—Diane I. Lee
*Assistant Examiner*—Chia-how Michael Liu
(74) *Attorney, Agent, or Firm*—Oliff & Berridge, PLC

(57) ABSTRACT

A projection optical system is a catoptric system in which a field of view region and an imaging region are located spaced from an optical axis, in which a numerical aperture of light reaching each point on an image plane is substantially uniform regardless of an image height and a direction. An aperture stop for defining the numerical aperture of the projection optical system is provided, and the aperture stop is provided with an aperture portion in a predetermined shape in which the numerical aperture of light reaching each point within a predetermined region is substantially uniform over the predetermined region, that is, in a shape in which dimensions concerning two directions perpendicular to each other are different from each other. A predetermined shape of the aperture portion is defined so as to compensate for the effect of non-uniformity of the numerical aperture of light reaching each point within a predetermined region due to a partial optical system arranged between the aperture stop and an image plane not satisfying a desired projective relationship.

18 Claims, 12 Drawing Sheets

PROJECTION OPTICAL SYSTEM, EXPOSURE APPARATUS, AND EXPOSURE METHOD IN WHICH A REFLECTIVE PROJECTION OPTICAL SYSTEM HAS A NON-CIRCULAR APERTURE STOP

This non-provisional application claims the benefit of U.S. Provisional Application No. 60/691,239 filed Jun. 17, 2005.

BACKGROUND OF THE INVENTION

This invention relates to a projection optical system, an exposure apparatus, and an exposure method. More specifically, this invention relates to a projection optical system that is preferably used in an exposure apparatus that manufactures devices such as a semiconductor element, using EUV light, in a photolithographic process.

Conventionally, in an exposure apparatus used in manufacturing a semiconductor element or the like, a circuit pattern formed on a mask (reticle) is projected and transferred onto a photosensitive substrate (for example, a wafer) via a projection optical system. A resist is coated on the photosensitive substrate, the resist is photosensitized by projection exposure via the projection optical system, and a resist pattern corresponding to a mask pattern is obtained.

Here, resolution W of an exposure apparatus depends on a wavelength $\lambda$ of exposure light and a numerical aperture NA of the projection optical system and is shown by the following equation (a).

$$W = k \cdot \lambda / NA \quad (k: \text{constant}) \quad (a)$$

Therefore, in order to improve the resolution of the exposure apparatus, the wavelength $\lambda$ of the exposure light is shortened, and the numerical aperture NA of the projection optical system needs to be increased. In general, increasing the numerical aperture NA of the projection optical system to a predetermined value or more is difficult from a perspective of optical design, so exposure light needs to have a shorter wavelength.

Therefore, as an exposure method (exposure apparatus) for the next generation of semiconductor patterning, an EUVL (Extreme Ultra Violet Lithography) method has been focused upon. In the EUVL exposure apparatus, compared to a conventional exposure method using a KrF excimer laser beam in which the wavelength is 248 nm and an ArF excimer laser beam in which the wavelength is 193 nm, EV (Extreme Ultra Violet) light having a wavelength of approximately 5-20 nm is used.

When EUV light is used as exposure light, an optically transmissive material that can be used does not exist. Because of this, in the EUVL exposure apparatus, a reflective type mask is naturally used, and a reflective type projection optical system is used.

SUMMARY OF THE INVENTION

In general, in a reflective type projection optical system used for an EUVL exposure apparatus, a field of view region on an object plane and an imaging region on an image plane are not located on the optical axis. This is because optical path separation is performed so that a reflective surface does not block a light beam to be transmitted. Meanwhile, in a Schwarzschild optical system, a field of view region and an imaging region are positioned on the optical axis, so light is transmitted via an aperture portion arranged in the center of a mirror.

In this case, the aperture of the optical system becomes an annular shape, and the resolution deteriorates for a specified spatial frequency, so this is not suitable for lithography. In general, in a projection optical system used for an EUVL exposure apparatus, as later mentioned, the numerical aperture of light reaching each point on the image plane varies depending on the direction. A numerical aperture of light reaching each point on the image plane being different depending on the direction means that irregularities in resolution occur due to the direction, and irregularities exist in a shape of a pattern formed on a photosensitive substrate via the projection optical system.

This invention reflects on the above-mentioned problem. An object of this invention is to provide a projection optical system that is a catoptric system in which a field of view region and an imaging region are located spaced from the optical axis, and in which a numerical aperture of light reaching each point on an image plane is substantially uniform regardless of the direction.

Additionally, another object of this invention is to provide an exposure apparatus and an exposure method that can reliably form a mask pattern on a photosensitive substrate at a large resolution, using a reflective type projection optical system in which a numerical aperture of light reaching each point on an image plane is substantially uniform regardless of the direction, for example, using EUV light as exposure light.

In order to address the above-mentioned problem, according to one aspect of this invention, a projection optical system, which is a reflective type, in which an image of a first plane is formed at a second plane in a predetermined region spaced from an optical axis, is provided with an aperture stop for defining a numerical aperture of the projection optical system, wherein the aperture stop is provided with an aperture portion in a predetermined shape in which a numerical aperture of light reaching each point within a predetermined region is substantially uniform over the predetermined region regardless of the direction, that is, in which dimensions in two directions perpendicular to each other are different from each other.

According to another aspect of this invention, a projection optical system, which is a reflective type, in which an image of a first plane is formed in a predetermined region spaced from an optical axis at a second plane, is provided with an aperture stop for defining a numerical aperture of the projection optical system, wherein the aperture stop is constituted so as to be replaceable with another aperture stop in a different aperture shape.

According to a third aspect of this invention, an exposure apparatus is provided with an illumination system for illuminating a mask set at the first plane, and the projection optical system described in the first or second aspect for forming an image of a pattern formed on the mask onto a photosensitive substrate set at the second plane.

According to a fourth aspect of this invention, an exposure method is provided, and includes the steps of illuminating a mask set at the first plane, and projecting and exposing an image of a pattern formed on the mask onto a photosensitive substrate set at the second plane via the projection optical system described in the first or second aspect.

According to a fifth aspect of this invention, a projection exposure apparatus includes an illumination optical system for illuminating a mask set at a first plane, a reflective type projection optical system for forming an image of a pattern formed on the mask in an arc region spaced from an optical axis on a photosensitive substrate set at a second plane, and a stage for holding the wafer and the photosensitive substrate so as to be relatively scanned, wherein in the arc region, the width in the scan movement direction is relatively narrow with respect to a width in a direction perpendicular to the scan movement direction. In addition, the projection optical system is provided with an aperture stop for defining a numerical aperture, and in an aperture shape of the aperture stop, the diameter in a direction corresponding to the scan movement direction is larger than the diameter in a direction corresponding to a direction perpendicular to the scan movement direction.

In a reflective type projection optical system of this invention, an aperture portion of the aperture stop is set to be a predetermined shape (for example, an elliptical shape) other than a round shape, so non-uniformity can be minimized due to the direction of the numerical aperture of the light beam reaching each point on the image plane.

That is, this invention can provide a projection optical system that is a catoptric system in which the field of view region and the imaging region are located spaced from the optical axis, in which the numerical aperture of the light reaching each point on the imaging plane is substantially uniform regardless of the direction. Therefore, in the exposure apparatus of this invention, using a reflective type projection optical system in which the numerical aperture of the light reaching each point on the image plane is substantially uniform regardless of the direction, for example, using EUV light as exposure light, a mask pattern can be reliably formed on a photosensitive substrate at a large resolution.

DETAILED DESCRIPTION OF PREFERRED EMBODIMENTS

The following specifically explains problems of conventional technology prior to explaining embodiments of this invention. In a reflective type projection optical system in which a view of field region and an imaging region are positioned apart from an optical axis, a numerical aperture on the optical axis cannot be defined with its usual meaning. Therefore, the numerical aperture NA off the optical axis is defined as shown in FIG. 1.

Figure 1:
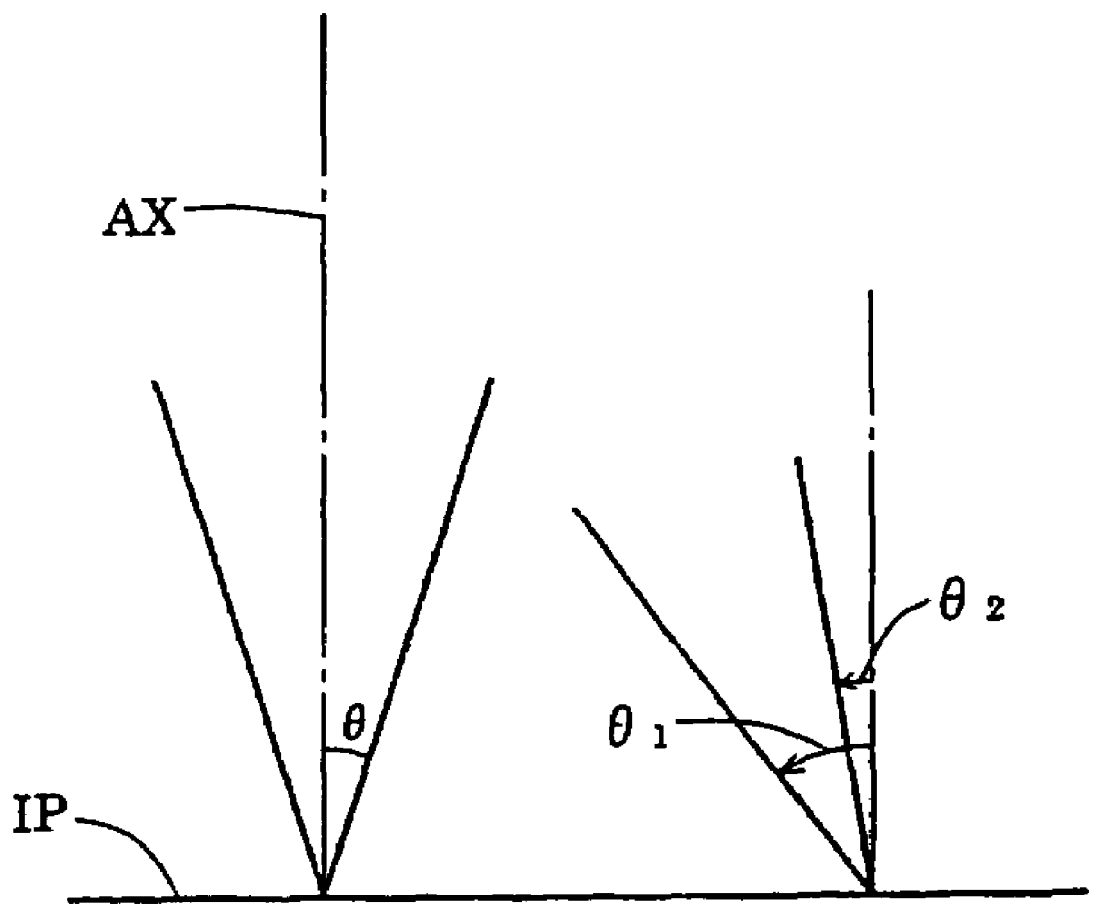
FIG. 1 is a diagram explaining definitions of numerical apertures on and off an optical axis, respectively.

In FIG. 1, a numerical aperture NAo on an optical axis is shown by the following equation (1), using an angle that an outermost light beam (light beam reaching an image plane IP passing through a periphery of an aperture portion) reaching the image plane IP forms with an optical axis AX, that is, incident angle θ. Meanwhile, a numerical aperture NA off the optical axis is defined by the following equation (2), using incident angles θ1 and θ2 of the outermost light beams reaching the image plane IP.

$$NAo = \sin \theta \tag{1}$$

$$NA = (\sin \theta 1 - \sin \theta 2)/2 \tag{2}$$

The definition of the numerical aperture NA off the optical axis is naturally introduced by a sine condition off the optical axis. A sine condition off an optical axis can be shown in "No. 4: Light Pencil" authored by Tadao Tsuruta and published by Shin-Gijyutsu Communications, P. 433, etc. In general, in a projection optical system, the numerical aperture NA off the optical axis is different from NAo on the optical axis. Furthermore, an aperture portion is a round shape, so the numerical aperture NA off the optical axis in a meridional direction is different from the numerical aperture NA off the optical axis in a sagittal direction. This phenomenon occurs due to various reasons.

First, a condition is considered in which NAo on the optical axis is identical to the numerical aperture NA off the optical axis. At least when the optical system satisfies the following three conditions, the numerical aperture NA of the light reaching each point on the image plane is uniform regardless of the imaging position and the direction.

Figure 2:
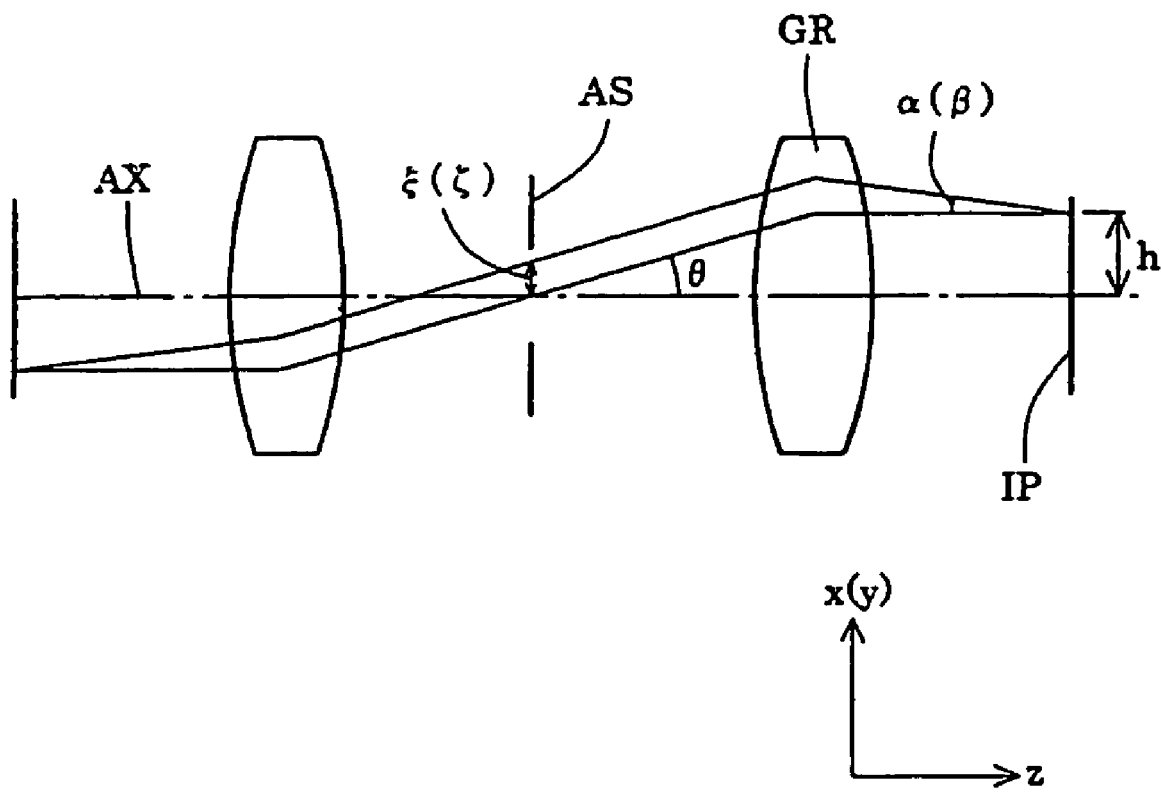
FIG. 2 is a diagram explaining a sine condition of a broad definition to be satisfied by a partial optical system, and a projective relationship.

(1) An optical system is substantially stigmatic
(2) In a partial optical system arranged between the aperture stop and the image plane, a sine condition in a broad definition is established. That is, as shown in FIG. 2, when the x direction angle of light reaching an arbitrary image point on the image plane IP (x direction incident angle), with respect to a normal line to the image plane IP, is α, and the y direction angle (y direction incident angle) is β, an x direction height ξ, from an optical axis AX of light when the light passes through an aperture stop AS, and a y direction height ζ, are shown by ξ=A sin α+B, and ζ=A sin β+C, respectively. Here, A, B, and C are constants determined by each image point.
(3) In the partial optical system arranged between the aperture stop and the image plane, the projective relationship shown by h=F sin θ is satisfied. That is, as shown in FIG. 2, when the light passes through the aperture stop AS, the angle formed by the principal ray with respect to the optical axis AX is defined as θ, and the height from the optical axis AX on the image plane IP of the principal ray is defined as h, and when a focal length of the above-mentioned partial optical system GR is F, the projective relationship shown by h=F sin θ is established.

In a projection optical system mounted to an exposure apparatus, the first condition in which an optical system is substantially stigmatic is satisfied. However, conditions other than the first condition, particularly, the third condition in which the partial optical system GR satisfies a desired projective relationship often causes significant errors. Hereafter, a case is considered in which the first and second conditions in which the partial optical system GR satisfies a sine condition in a broad definition are satisfied, but the third condition is not satisfied. That is, a case is considered in which the projective relationship of the partial optical system GR is shown by h=F·g (θ), using a function g (θ) in which θ is a variable.

At this point, the numerical aperture NA off the optical axis, that is, a numerical aperture NAm in a meridional direction and a numerical aperture NAs in a sagittal direction of the light reaching each point other than the optical axis on the image plane are shown by the following equations (3) and (4), respectively, using the numerical aperture NAo on the optical axis.

$$NAm = NAo \cdot \cos\theta / (dg(\theta)/d\theta) \qquad (3)$$

$$NAs = NAo \cdot \sin\theta / g(\theta) \qquad (4)$$

In equations (3) and (4), if g(θ)=sin θ, NAm=NAs=NAo. It is clear that the numerical aperture NA of the light reaching each point on the image plane becomes uniform regardless of the image height and the direction. In general, g (θ)≠sin θ, so the numerical aperture NA of the light reaching each point on the image plane does not become uniform. Here, if the projective relationship departs from g (θ)=sin θ, the specific way it departs is considered.

In reality, in a projection optical system mounted to an exposure apparatus as well, the main component of aberration is third order aberration. Thus, if only the third order aberration component is considered, function g (θ) can be shown by the following equation (5). Here, δ is a constant showing an amount out of F sin θ of the projective relationship provided by the optical system.

$$g(\theta) \approx \sin\theta + \delta \cdot \sin 3\theta \qquad (5)$$

If function g (θ) shown by equation (5) is substituted for the above-mentioned equations (3) and (4), the numerical aperture NAm in the meridional direction and the numerical aperture NAs in the sagittal direction are shown by the following equations (6) and (7), respectively.

$$NAm = NAo / (1 + 3\delta \cdot \sin 2\theta) \qquad (6)$$

$$NAs = NAo / (1 + \delta \sin 2\theta) \qquad (7)$$

According to equations (6) and (7), the numerical aperture NA of the light reaching each point on the image plane varies depending on the image height (depending on θ), and if the error amount from the numerical aperture NAo on the optical axis in the sagittal direction is 1, the error amount in the meridional direction is 3. Thus, in general, in a projection optical system, the numerical aperture NA of the light reaching each point on the image plane varies depending on the image height and the direction. Meanwhile, as mentioned before, the resolution of the projection optical system is proportional to λ/NA (λ is a wavelength of light that is used).

Therefore, variance of the numerical aperture NA of the light depending on the image height and the direction means existence of irregularities in the resolution of the projection optical system due to the direction. If there are irregularities in the resolution of the projection optical system due to the direction, the shape of a micro pattern that is formed when a semiconductor circuit is exposed changes depending on the direction. As a result, a capacitor or a transistor to be ultimately manufactured does not have a predetermined electrical characteristic (conductance, impedance, etc.) intended by an electric circuit designer, and in the worst case, an integrated circuit is defective.

The most optically desired method to handle the above-mentioned problem is to design an optical system that satisfies all of the above-mentioned first through third conditions. However, although designing an optical system that satisfies all of the first through third conditions is theoretically possible, but it is not actually feasible because of complexity of a mirror structure, the increasing number of mirrors, significant increase of assembly precision that is needed, and significant cost increase. In particular, in EUVL exposure apparatus, the increasing number of reflective mirrors deteriorates the exposure dose because the reflection efficiency of the mirrors is not very high, and the product value also deteriorates.

The inventors of this application obtained a technical concept in which a numerical aperture NA of light reaching each point on an image plane can be substantially uniform regardless of the direction by setting a shape of an aperture portion of an aperture stop defining a numerical aperture of a projection optical system in a predetermined shape (for example, an elliptical shape) instead of a normal round shape. The following explains a specific content of the technical concept of this invention with reference to embodiments of this invention.

Embodiments of this invention are explained based on the attached drawings.

Figure 3:
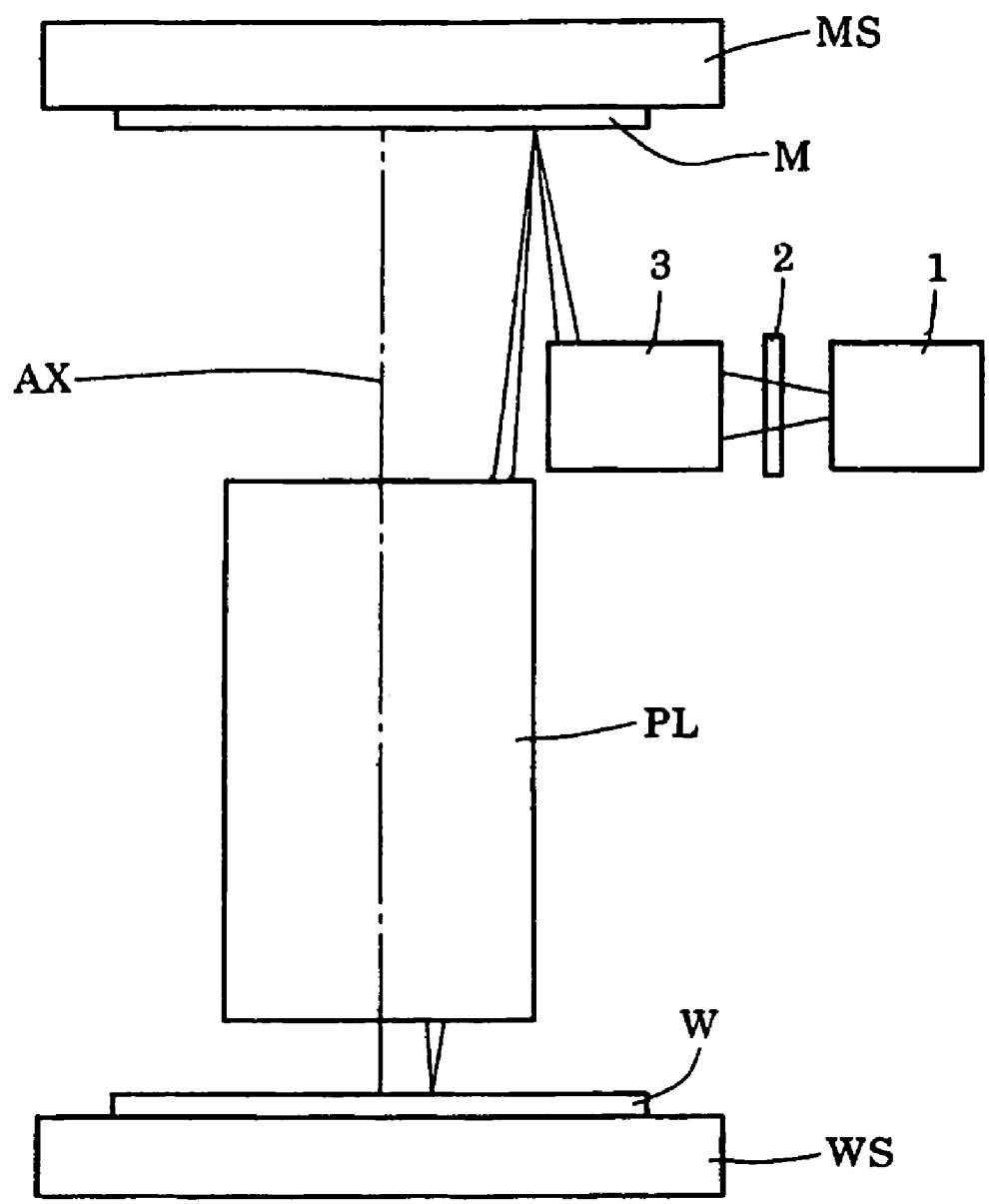
FIG. 3 is a diagram schematically showing a structure of an exposure apparatus of an embodiment of this invention.
Figure 4:
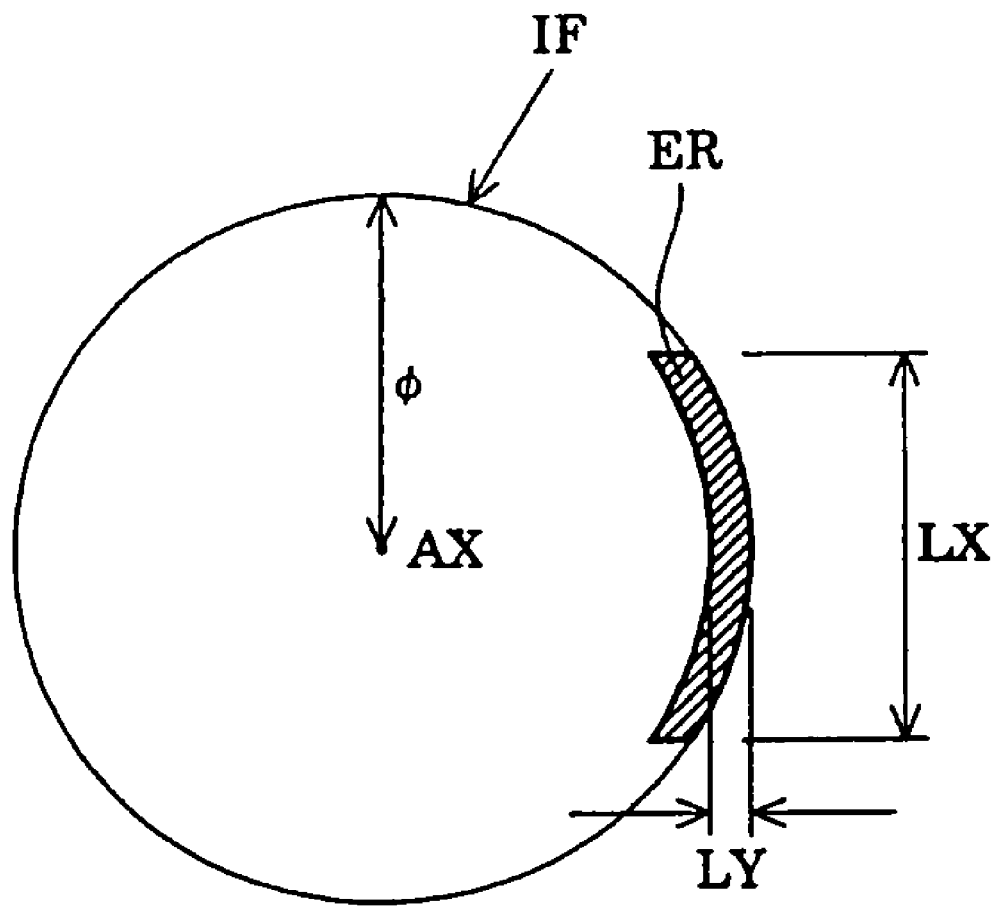
FIG. 4 is a diagram schematically showing a positional relationship between an arc-shaped stationary exposure region formed on a wafer of the exposure apparatus of FIG. 3 and an optical axis.

FIG. 3 is a diagram schematically showing a structure of an exposure apparatus according to embodiments of this invention. Furthermore, FIG. 4 is a diagram showing a positional relationship between an arc-shaped stationary exposure region (that is, effective exposure region) formed on a wafer in the exposure apparatus of FIG. 3 and an optical axis. In FIG. 3, a Z axis extends along a line direction normal to a wafer W that is a photosensitive substrate, a Y axis extends in a direction parallel to a paper plane of FIG. 3 within a plane of the wafer W, and an X axis extends in a direction perpendicular to the paper plane of FIG. 3 within the plane of the wafer W.

In FIG. 3, the exposure apparatus of this embodiment is provided with, for example, a laser plasma light source 1 as a light source to supply exposure light. The light exited from the light source 1 enters an illumination optical system 3 via a wavelength selection filter 2. Here, the wavelength selection filter 2 has a characteristic that is transmitting only EUV light (X-ray) of a predetermined wavelength (for example, 13.5 nm) from the light supplied by the light source 1 and preventing transmitting of other wavelength light.

The EUV light that passed through the wavelength selection filter 2 illuminates a reflective type mask M in which a pattern to be transferred is formed via the illumination optical system 3 constituted by a plurality of reflective mirrors. The mask M is held by a mask stage MS movable along the Y direction so that the pattern surface extends along an XY plane. Additionally, movement of the mask stage MS is controlled based on measurements made by an undepicted laser interferometer. Thus, on the mask M, an arc-shaped illumination region (field of view region) is formed, which is symmetrical with respect to the Y axis.

The light from the pattern of the illuminated mask M forms an image of a mask pattern on the wafer W, which is a photosensitive substrate, via a reflective type projection optical system PL. That is, on the wafer W, as shown in FIG. 4, an arc-shaped stationary exposure region (effective exposure region: imaging region) ER is formed, which is symmetrical with respect to the Y axis. In FIG. 4, within an arc-shaped region (image circle) IF having a radius φ about an optical axis AX, the arc-shaped stationary exposure region ER is arranged in which the length in the X direction is LX and the length in the Y direction is LY so as to be tangent to the image circle IF.

The wafer W is held by a wafer stage WS that is two-dimensionally movable along the X and Y directions so that the exposure surface extends along the XY plane. Furthermore, in the same manner as the mask stage MS, movement of the wafer stage WS is controlled based on measurements made by an undepicted laser interferometer. Thus, while the mask stage MS and the wafer stage WS are moved along the Y direction, that is, while the mask M and the wafer W are relatively moved along the Y direction with respect to the projection optical system PL, scanning exposure is performed. Thus, a pattern of the mask M is transferred onto one shot region (exposure region) on the wafer W.

Figure 5:
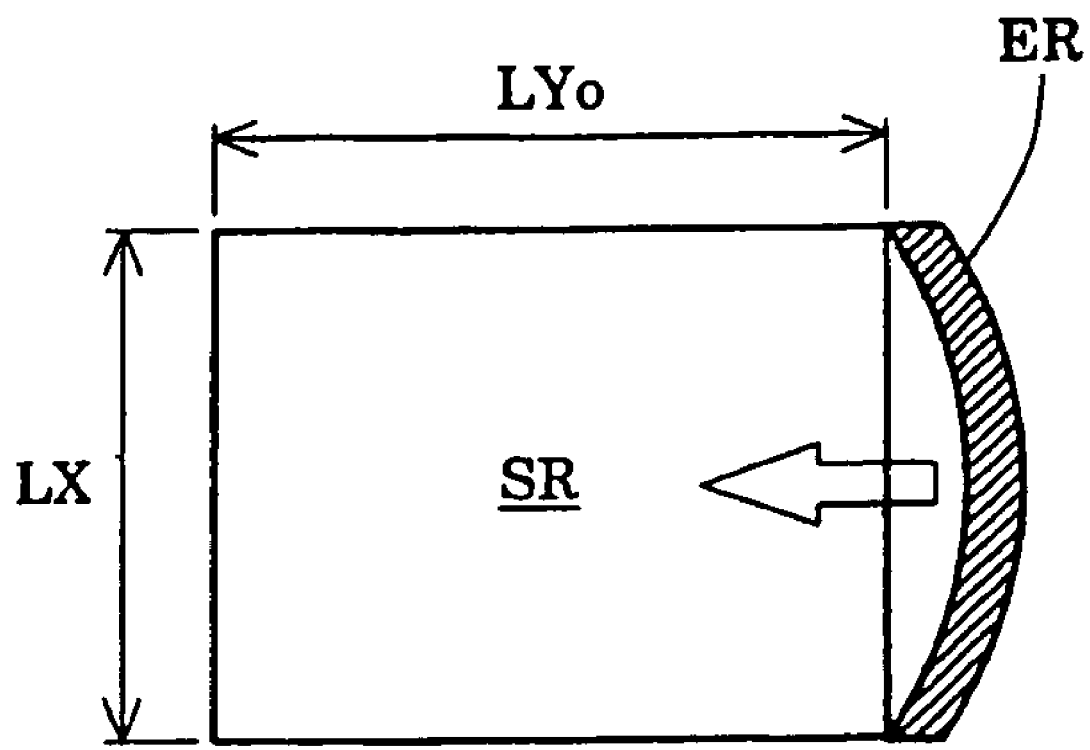
FIG. 5 is a diagram schematically showing a state in which one shot region is formed on a wafer by scanning exposure.

In FIG. 5, the length of one shot region SR in the X direction corresponds to the length LX in the X direction of the stationary exposure region ER, and the length in the Y direction corresponds to the length LYo depending on the moving distance of the wafer W. Furthermore, when the projection magnification (transfer magnification) of the projection optical system PL is ¼, the moving velocity of the wafer stage WS is set at ¼ of the moving velocity of the mask stage MS, and synchronous scanning is performed. Furthermore, by repeating the step movement of the wafer stage WS along the X direction and the scan movement along the Y direction, a pattern of the mask M is consecutively transferred onto each shot region of the wafer W.

Figure 6:
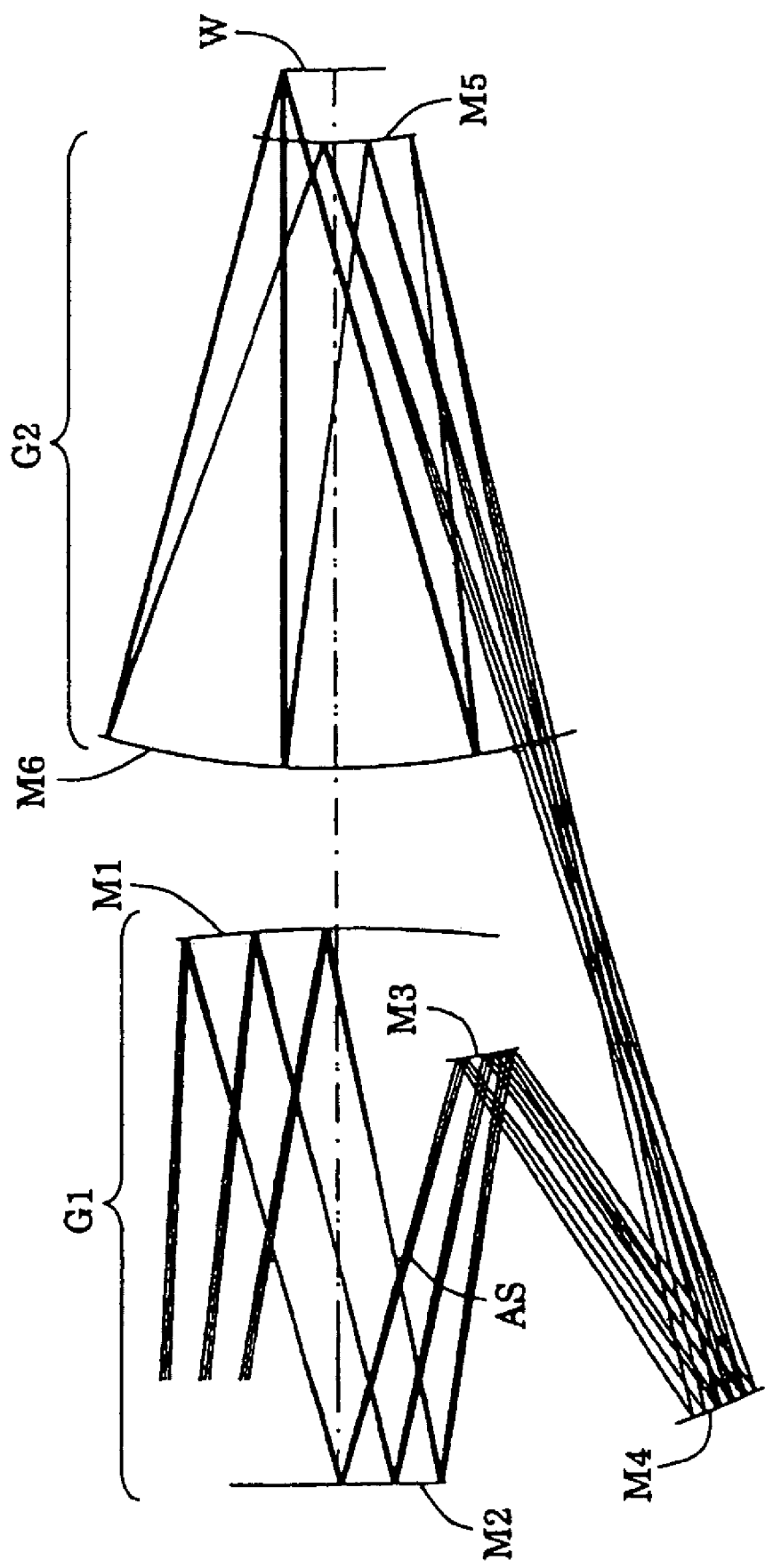
FIG. 6 is a diagram schematically showing a structure of a projection optical system of this embodiment.

FIG. 6 is a diagram schematically showing a structure of a projection optical system according to this embodiment. In FIG. 6, the projection optical system PL of this embodiment is constituted by a first reflective imaging optical system G1 to form an intermediate image of a pattern of the mask M and a second reflective imaging optical system G2 to form an image of the intermediate image of the mask pattern (secondary image of the pattern of the mask M).

The first reflective imaging optical system G1 is constituted by four reflective mirrors M1-M4. The second reflective imaging optical system G2 is constituted by two reflective mirrors M5 and M6. Furthermore, the projection optical system PL is an optical system that is telecentric with respect to a wafer side (imaging side). In addition, reflective surfaces of all the reflective mirrors M1-M6 are formed in an aspherical shape that is rotationally symmetrical with respect to the optical axis, and an aperture stop AS is arranged on an optical path from the first reflective mirror M1 to the second reflective mirror M2.

Furthermore, when the height in the direction perpendicular to the optical axis is y, the distance (sag amount) along the optical axis to a position on the aspherical surface at a height y from the tangential plane on the vertex of the aspherical surface is z, a vertex radius of curvature is r, a conical coefficient is κ, and an n-order aspherical coefficient is Cn, the aspherical surface is shown by the following equation (b).

$$z=(y^2/r)/[1+\{1-(1+\kappa)\cdot y^2/r^2\}^{1/2}]+C_4\cdot y^4+C_6\cdot y^6+C_8\cdot y^8+C_{10}\cdot y^{10}+\ldots \quad (b)$$

In the projection optical system PL of this embodiment, after the light from the mask M (undepicted in FIG. 6) is reflected by a reflective surface of a first concave surface reflective mirror M1, a reflective surface of a second concave surface reflective mirror M2, a reflective surface of a third convex surface reflective mirror M3, and a reflective surface of a fourth concave surface reflective mirror M4 in order, an intermediate image of the mask pattern is formed. Furthermore, after the light from the intermediate image of the mask pattern formed via the first reflective imaging optical system G1 is reflected by the reflective surfaces of the fifth convex surface reflective mirror M5 and the sixth concave surface reflective mirror M6 in order, a reduced image (secondary image) of the mask pattern is formed on the wafer W.

The following Table (1) shows values of the projection optical system PL according to this embodiment. In Table (1), λ shows a wavelength of exposure light (EUV light), β shows a projection magnification, NA shows a numerical aperture on an image side (wafer side), H0 shows a maximum object height on the mask M, φ shows a radius (maximum image height) of the image circle IF on the wafer W, LX shows a dimension of the stationary exposure region ER along the X direction, and LY shows a dimension of the stationary exposure region ER along the Y direction.

Additionally, the surface number shows a sequence of the reflective surface from the mask side along the direction in which the light moves to the wafer surface, which is an image plane, from the mask surface, which is an object surface; r shows a vertex radius of curvature (mm) of each reflective surface, and d shows an interval of each reflective surface on the axis, that is, the surface interval (mm). Additionally, the surface interval d changes the sign every time the light is reflected. In addition, regardless of the direction in which the light enters, a radius of curvature of a convex surface toward the mask side is positive, and a radius of curvature of a concave surface is negative.

TABLE (1)

(Main Information)

$\lambda$ = 13.5 nm
$\beta$ = ¼
NA = 0.26
H0 = 124 mm
$\phi$ = 31 mm
LX = 26 mm
LY = 2 mm (Optical Member Information)

| Surface Number | r | d | |
|---|---|---|---|
| 1 | (Mask Surface) | 652.352419 | |
| 1 | −790.73406 | −209.979693 | (First reflective mirror M1) |
| 2 | ∞ | −141.211064 | (Aperture stop AS) |
| 3 | 3000.00000 | 262.342040 | (Second reflective mirror M2) |
| 4 | 478.68563 | −262.292922 | (Third reflective mirror M3) |
| 5 | 571.53754 | 842.912526 | (Fourth reflective mirror M4) |
| 6 | 296.70332 | −391.770887 | (Fifth reflective mirror M5) |
| 7 | 471.35911 | 436.582453 | (Sixth reflective mirror M6) |
| (Wafer Surface) | | | |

(Aspherical data)

First surface $\kappa$ = 0.000000
$C_4$ = 0.246505 × 10$^{-8}$
$C_6$ = −0.446668 × 10$^{-13}$
$C_8$ = 0.120146 × 10$^{-17}$
$C_{10}$ = −0.594987 × 10$^{-22}$
$C_{12}$ = 0.340020 × 10$^{-26}$
$C_{14}$ = 0.254558 × 10$^{-30}$
$C_{16}$ = −0.806173 × 10$^{-34}$ TABLE (1)-continued C18 = 0.686431 × 10⁻³⁸
C20 = −0.209184 × 10⁻⁴²
Third Surface $\kappa$ = 0.000000
C4 = −0.413181 × 10⁻⁹
C6 = 0.717222 × 10⁻¹⁴
C8 = −0.713553 × 10⁻¹⁹
C10 = 0.255721 × 10⁻²¹
C12 = −0.495895 × 10⁻²⁴
C14 = 0.324678 × 10⁻²⁷
C16 = −0.103419 × 10⁻³⁰
C18 = 0.164243 × 10⁻³⁴
C20 = −0.104535 × 10⁻³⁸
Fourth Surface $\kappa$ = 0.000000
C4 = −0.217375 × 10⁻⁸
C6 = 0.385056 × 10⁻¹³
C8 = −0.347673 × 10⁻¹⁷
C10 = 0.186477 × 10⁻²¹
C12 = −0.244210 × 10⁻²⁶
C14 = −0.704052 × 10⁻³⁰
C16 = 0.833625 × 10⁻³⁴
C18 = −0.418438 × 10⁻³⁸
C20 = −0.792241 × 10⁻⁴³
Fifth Surface $\kappa$ = 0.000000
C4 = −0.380907 × 10⁻¹⁰
C6 = −0.334201 × 10⁻¹⁵
C8 = 0.113527 × 10⁻¹⁹
C10 = −0.535935 × 10⁻²⁵
C12 = −0.416047 × 10⁻²⁹
C14 = 0.881874 × 10⁻³⁴
C16 = −0.583757 × 10⁻³⁹
C18 = −0.780811 × 10⁻⁴⁵
C20 = 0.176571 × 10⁻⁴⁹
Sixth Surface $\kappa$ = 0.000000
C4 = −0.190330 × 10⁻⁸
C6 = 0.134021 × 10⁻¹¹
C8 = −0.471080 × 10⁻¹⁶
C10 = −0.968673 × 10⁻²⁰
C12 = 0.284390 × 10⁻²²
C14 = −0.265057 × 10⁻²⁵
C16 = 0.131472 × 10⁻²⁸
C18 = −0.341329 × 10⁻³²
C20 = 0.365714 × 10⁻³⁶
Seventh Surface $\kappa$ = 0.000000
C4 = 0.668635 × 10⁻¹⁰
C6 = 0.359674 × 10⁻¹⁵
C8 = 0.468613 × 10⁻²⁰
C10 = −0.440976 × 10⁻²⁴
C12 = 0.431536 × 10⁻²⁸
C14 = −0.257984 × 10⁻³²
C16 = 0.938415 × 10⁻³⁷
C18 = −0.190247 × 10⁻⁴¹
C20 = 0.165315 × 10⁻⁴⁶

In the projection optical system PL of this embodiment, as an imaging region in which each aberration is preferably corrected with respect to EUV light with a wavelength of 13.5 nm, an arc-shaped stationary exposure region of 26 mm (=LX)×2 mm (=LY) is obtained on the wafer W. Therefore, on the wafer W, to each shot region having a size of, for example, 26 mm (=LX)×33 mm (=LYo), a pattern of the mask M is transferred by scanning exposure.

That is, in the projection optical system PL of this embodiment, as shown in FIG. 4, an effective imaging region (stationary exposure region) ER is limited to an arc-shaped region of 26 mm×2 mm, and an effective image height is limited to a relatively narrow range of 26 mm-31 mm (effective object height is 116 mm-124 mm). As described before, this is because, in the reflective type projection optical system PL of this embodiment, optical path separation has to be performed so that the reflective surface does not shield the light to be transmitted.

Figure 7:
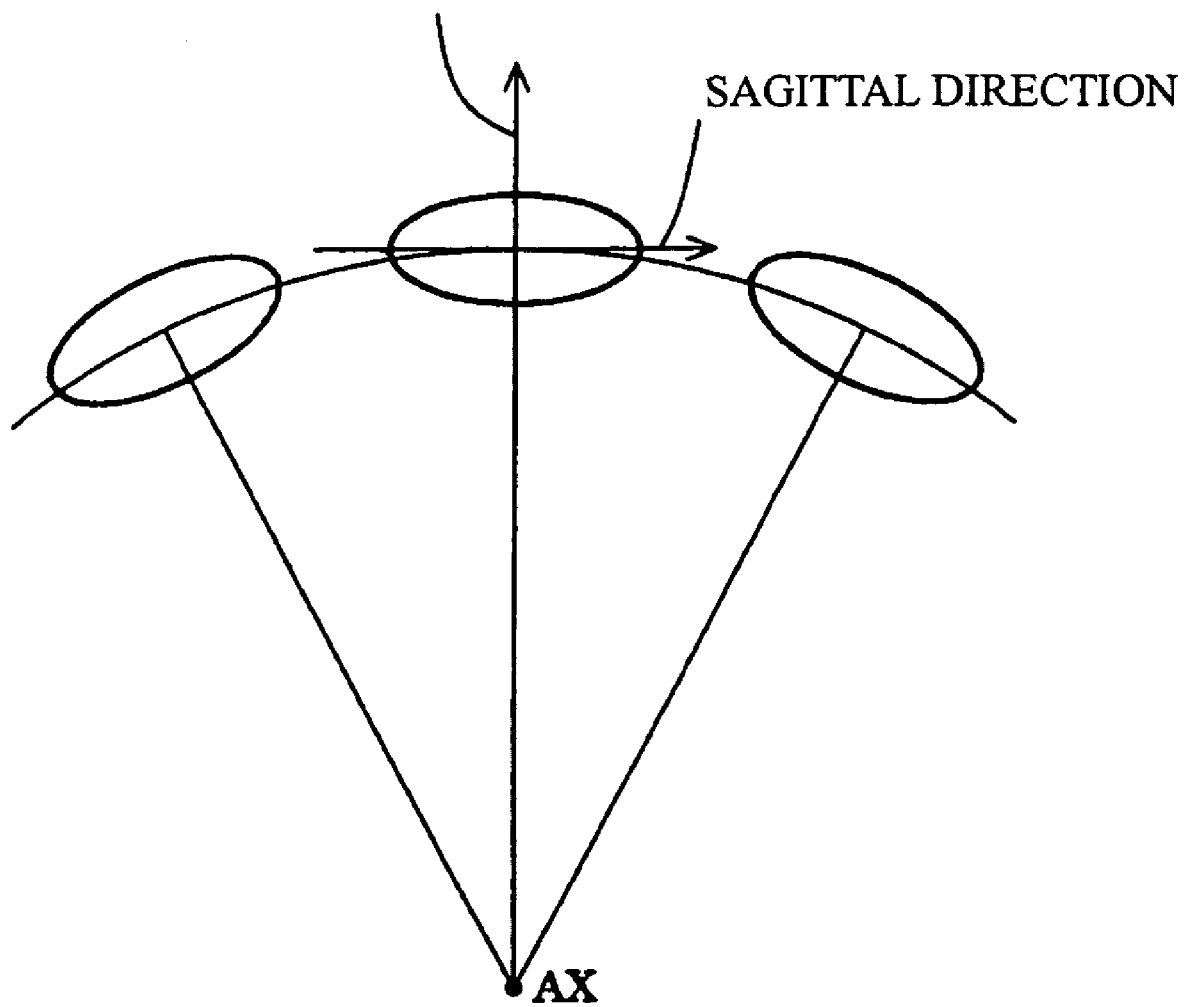
FIG. 7 is a diagram schematically showing an aperture distortion direction and a distortion state at each point of an imaging region when an aperture portion is made to be a round shape according to conventional technology.

In the projection optical system PL of this embodiment, as shown in FIG. 4, the effective imaging region (stationary exposure region) ER is limited to an arc-shaped region of 26 mm×2 mm, and this is merely a rather short arc-shaped region out of the entire circumference of the image field IF. Therefore, if the aperture portion of the aperture stop AS is made to be a round shape, the numerical aperture NAm in the meridional direction and the numerical aperture NAs in the sagittal direction, that is, the distortion direction and the distortion state of the aperture become substantially the same over the entire imaging region as shown in FIG. 7. FIG. 7 shows the distortion degree of the aperture as an elliptical shape when the aperture portion is made to be a round shape.

Specifically, in the projection optical system PL of this embodiment, according to conventional technology, if the aperture portion of the aperture stop AS is set to be a round shape in which a diameter is 68.348 mm, the following Table (2) shows the numerical aperture NAm in the meridional direction and the numerical aperture NAs in the sagittal direction of the imaging region at points of the respective image heights.

TABLE (2)

| | |
|---|---|
| NAm at point of image height 29 mm: | 0.250765182507 |
| NAs at point of image height 29 mm: | 0.258042961396 |
| NAm at point of image height 31 mm: | 0.249217797699 |
| NAs at point of image height 31 mm: | 0.257476183744 |

Figure 8:
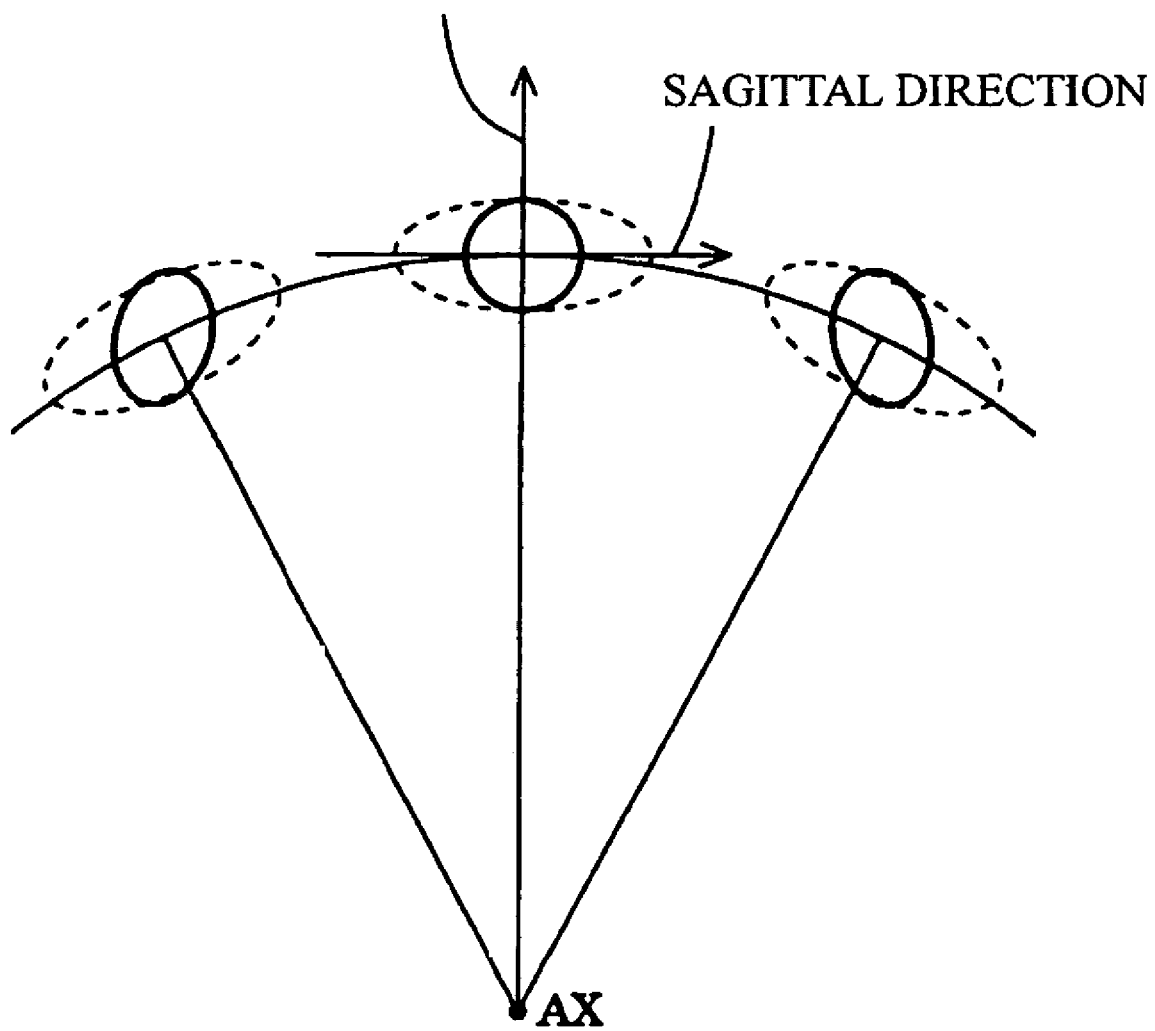
FIG. 8 is a diagram schematically showing an aperture distortion direction and a distortion state at each point of an imaging region when an aperture portion is made to be an elliptical shape according to this invention.

Therefore, in this embodiment, by making the aperture portion of the aperture stop AS a predetermined shape other than a round shape, for example, an elliptical shape, as shown in FIG. 8, the aperture distortion can be suitably controlled over the entire imaging region, and the numerical aperture NAm in the meridional direction and the numerical aperture NAs in the sagittal direction are constituted so as to be substantially the same over the entire imaging region. FIG. 8 shows the aperture distortion degree in the heavy elliptical lines when the aperture portion is made to be an elliptical shape. Furthermore, the broken elliptical lines in FIG. 8 correspond to elliptical lines of FIG. 7 showing the aperture distortion degree when the aperture portion is made to be a round shape. Specifically, in FIG. 8, on the right and left ends of the arc shape, the XY direction does not correspond to the meridional/sagittal directions. Thus, strictly speaking, NA does not become a round shape, but becomes a substantially elliptical shape. Thus, in the center, NA becomes a substantially uniform round shape, but on the right and left ends of the arc shape, strictly speaking, NA becomes an non-uniform, non-round shape. However, even if NA does not become a completely round shape, an effect is obtained in which the NA difference between the meridional direction and the sagittal direction (or NA difference between the X direction and the Y direction) can be made small.

Figure 9:
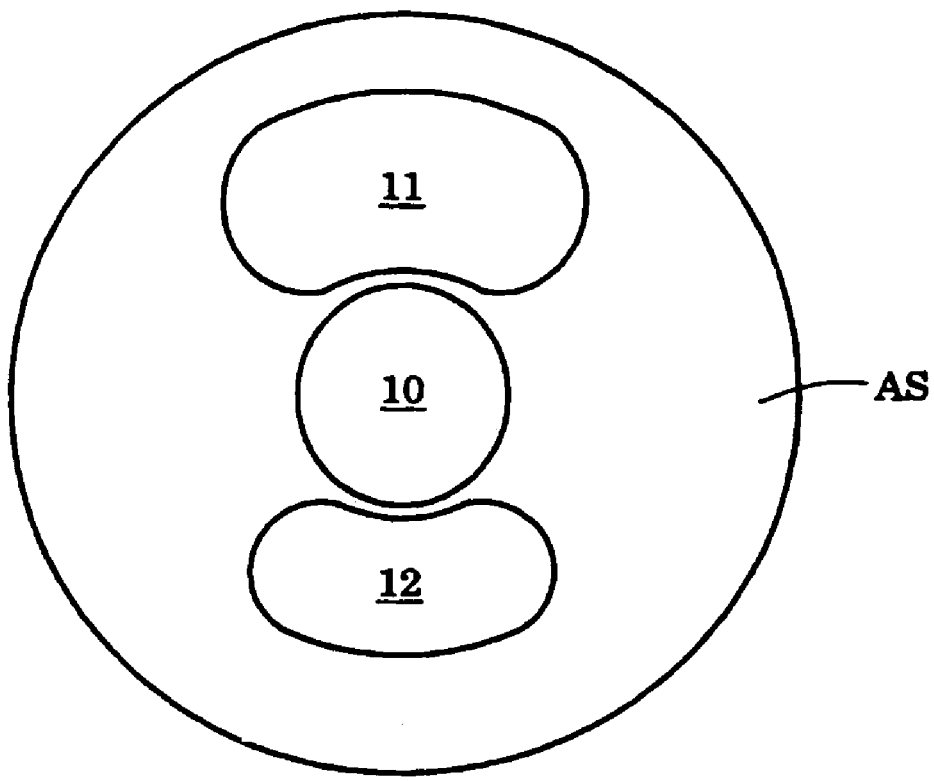
FIG. 9 is a diagram schematically showing an aperture stop having an elliptical aperture portion having a long diameter in a meridional direction.
Figure 9:
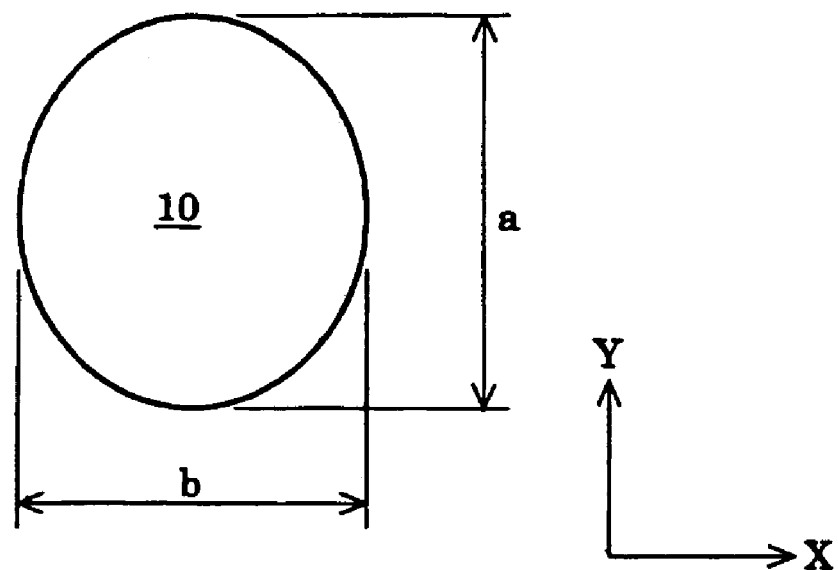

FIG. 9 shows an example showing an aperture portion of an elliptical-shaped aperture stop. In this figure, the diameter in the Y direction of an aperture portion 10 of the aperture stop AS is a, and the diameter in the X direction is b. In FIG. 9, a is larger than b. This is because the EUV exposure apparatus needs to minimize the number of mirrors in order to suppress deterioration of the exposure light amount as described above. Because of this, in general, the projective relationship becomes h>F sin θ, so as shown in FIG. 9, it is preferable that the numerical aperture in the sagittal direction should be made to be a shape that is relatively small. However, when the projective relationship becomes h<F sin θ, it is preferable that the value of a needs to be made smaller than the value of b in FIG. 9. In addition, depending on the case, it is preferable that the shape of the aperture stop is determined upon considering optical characteristics such as a sine condition, etc.

If the image height of effective light to be used for exposure is limited to a relatively narrow range, in the above-mentioned equations (6) and (7), even if a deviation amount δ from a desired projective relationship is large to some degree, non-uniformity due to the image height of the numerical aperture NA of the light reaching each point on the image plane can be ignored. Therefore, if the image height of the effective light to be used for exposure is limited to a relatively narrow range, such as 29 mm through 31 mm, just like this embodiment, non-uniformity of the numerical aperture NA due to the image height also can be improved.

Specifically, in the projection optical system PL of this embodiment, as shown in FIG. 9, according to this invention, if the aperture portion 10 of the aperture stop AS is set to be an elliptical shape such that the long diameter (meridional direction) is 68.348 mm and the short diameter (sagittal direction) is 66.254 mm, the following Table (3) shows the numerical aperture NAm in the meridional direction and the numerical aperture NAs in the sagittal direction in each image height of the imaging region. Furthermore, in FIG. 9, an auxiliary aperture portion 11 is an aperture portion to transmit a predetermined light beam from the mask M to the first reflective mirror M1, and an auxiliary aperture portion 12 is an aperture portion to transmit a predetermined light beam from the second reflective mirror M2 to the third reflective mirror M3.

TABLE (3)

| | |
|---|---|
| NAm at point of image height 29 mm: | 0.250765272746 |
| NAs at point of image height 29 mm: | 0.250272182607 |
| NAm at point of image height 31 mm: | 0.249217758088 |
| NAs at point of image height 31 mm: | 0.24972074902 |

As shown in Table (2), by using this invention, the numerical aperture NA of 0.2507-0.2580, which is relatively significantly dispersed, at point of the image height 29 mm becomes 0.2507-0.2502, which is small, as shown in Table (3), and the dispersion can be suppressed to approximately ⅕. In the same manner, by using this invention, the numerical aperture NA of 0.2492-0.2574, which is relatively significantly dispersed, at point of the image height 31 mm becomes 0.2492-0.2497, which is small, and the dispersion can be suppressed to approximately 1/16. Thus, in the projection optical system PL of this embodiment, the effective imaging region is limited to a relatively long, thin arc-shaped region, and the effective image height is limited to a relatively narrow range, so non-uniformity, due to the image height, of the numerical aperture NA of the light reaching each point on the image plane can be minimized. Furthermore, in the projection optical system PL of this embodiment, the aperture portion of the aperture stop AS is set to be a predetermined elliptical shape, so non-uniformity, due to the direction, of the numerical aperture NA of the light reaching each point on the image plane also can be minimized.

That is, in this embodiment, the projection optical system PL that is a catoptric system in which a field of view region and an imaging region are located spaced from an optical axis can be accomplished in which the numerical aperture of the light reaching each point on the image plane is substantially uniform regardless of the direction. Therefore, in the exposure apparatus of this embodiment, the reflective type projection optical system PL is used in which the numerical aperture of the light reaching each point on the image plane is substantially uniform regardless of the direction, and EUV light is used as exposure light. Thus, a pattern on the mask M can be reliably formed on the wafer W at a large resolution.

For example, in the projection optical system PL of this embodiment, the following Table (4) shows a focal length F of a partial optical system GR (M2-M6) arranged between the aperture stop AS and the wafer W (image plane), and a function g (θ) that defines the projective relationship of the partial optical system GR (M2-M6).

TABLE (4)

$F = -129.186524007$ mm $g(\theta) = -1.089581416414470 \times 10^{-8} + 9.983031116454740 \times 10^{-1} \times \theta -$
$2.608569671543950 \times 10^{-4} \times \theta 2 + 1.693133763108080 \times 10^{-1} \times$
$\theta 3 + 3.272877426399590 \times 10^{-1} \times \theta 4 - 1.064541314452320 \times$
$10^{1} \times \theta 5 + 2.105681558275050 \times 10^{2} \times \theta 6 - 1.964921359054180 \times$
$10^{3} \times \theta 7 + 9.263250785150350 \times 10^{3} \times \theta 8 - 2.172610074916260 \times$
$10^{4} \times \theta 9 + 2.026470680865160 \times 10^{4} \times \theta 10$ If calculation is performed based on the parameter g (θ) shown in Table (4), the ratio between the numerical aperture NAs in the sagittal direction and the numerical aperture NAm in the meridional direction at a point of the image height 29 mm, that is, NAs/Nam, has a value shown by the following equation (8).

$$NAs/NAm = \{\sin\theta / g(\theta)\} / \{\cos\theta / (dg(\theta)/d\theta)\} \quad (8)$$

$$= 1.034204511394000$$

It is confirmed that the value shown by equation (8) is an actual value of NAs/NAm, that is, the value is extremely close to 1.029022286, and that in terms of the generation of the difference, depending on the direction, of the numerical aperture NA at each image height of the imaging region, the factors of the third condition are dominant. Furthermore, in equation (8), it is desirable that the aperture portion of the aperture stop AS should be set in an elliptical shape in which the ratio between the long diameter and short diameter is tan θ: g (θ)/(d g (θ)/d θ).

Figure 10:
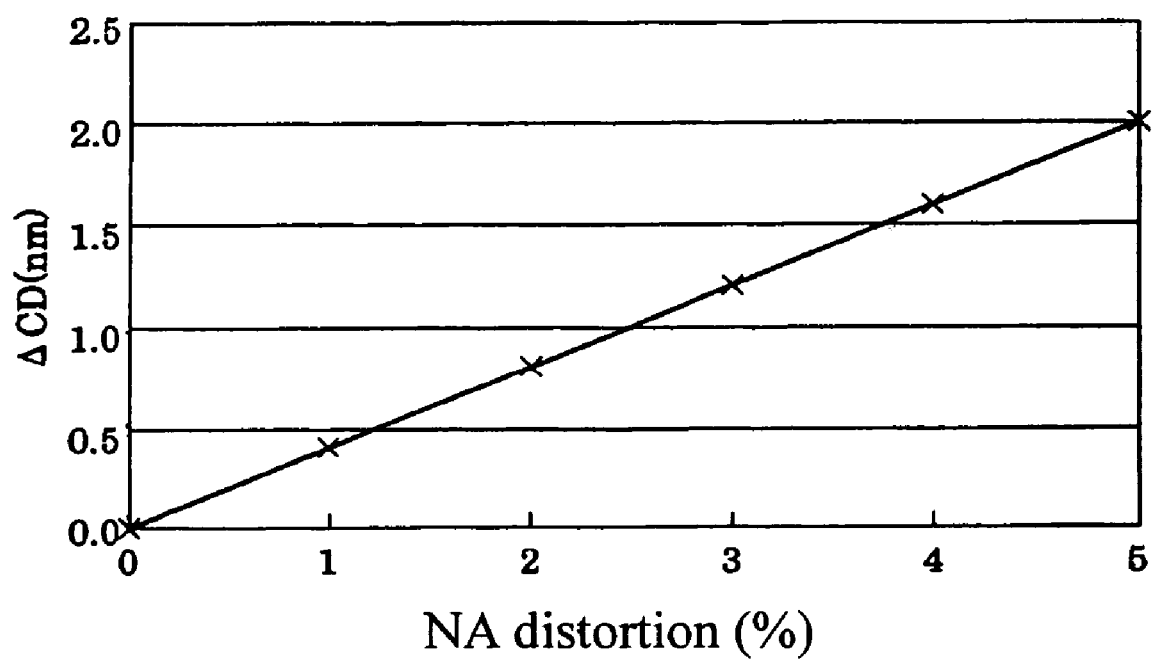
FIG. 10 is a diagram showing a simulation result on effects given to imaging by aperture distortion.

FIG. 10 is a diagram showing a simulation result concerning effects that aperture distortion causes to imaging. In FIG. 10, the horizontal axis shows NA distortion (that is, distortion degree between the numerical aperture NAm in the meridional direction and the numerical aperture NAs in the sagittal direction), and the vertical axis shows errors ΔCD from a predetermined line width. In this simulation, the image side NA of the projection optical system was 0.18, σ (coherence factor: exit side numerical aperture of the illumination optical system/incident side numerical aperture of the projection optical system) was 0.8, the light wavelength λ was 13.5 nm, and an isolated line pattern mask was used in which the line width was 45 nm. A pattern in which the line width is 25 nm was exposed on the wafer with higher dose.

Thus, the vertical axis ACD (nm) of FIG. 10 shows a line width error from 25 nm that is a predetermined line width. In general, if 10% (25 nm×0.1=2.5 nm in the case of this simulation) error occurs with respect to a pattern line width, it is understood that a semiconductor integrated circuit becomes defective. In FIG. 10, several percentage of NA distortion gives a serious effect as to whether a semiconductor integrated circuit becomes defective.

Figure 11A:
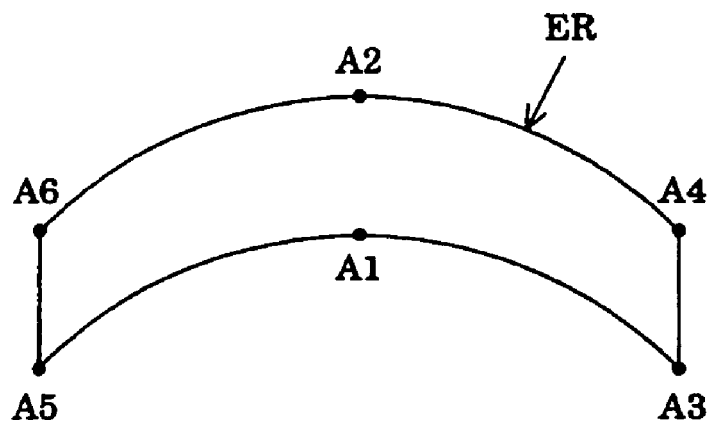
FIG. 11 is a diagram explaining a preferred condition to be specifically satisfied by an aperture portion of an aperture stop.

With reference to FIG. 11, the following explains a preferable specific condition of the aperture portion of the aperture stop AS to be satisfied. First, as shown in FIG. 11(a), a plurality of image points on the arc-shaped imaging region (predetermined region) ER of the image plane (second surface) of the projection optical system PL are defined as A1, A2, A3 . . . , An. Furthermore, one arbitrary image point among a plurality of image points is defined as Ai. Here, a plurality of image points are sampled a plurality of times at a substantially equal interval on the arc-shaped imaging region ER of the image plane. In FIG. 11(a), in order to simplify the explanation, only six image points A1-A6 are shown.

Figure 11B:
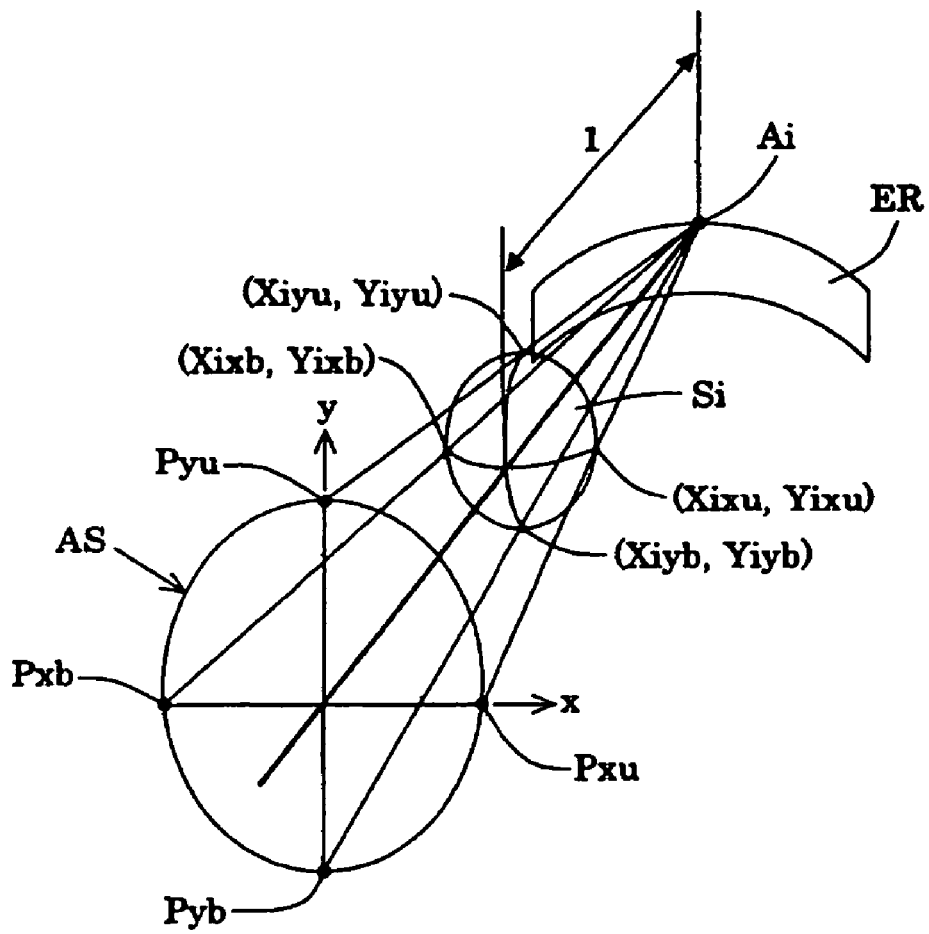

Furthermore, as shown in FIG. 11(b), two coordinate axes x, y perpendicular to each other on a plane (XY plane) parallel to a plane including the aperture stop AS are established. On the aperture stop periphery, the point at which the coordinate x is at a maximum is defined as Pxu, the point at which the coordinate x is at a minimum is Pxb, the point at which the coordinate y is at a maximum is Pyu, and the point at which the coordinate y is at a minimum is Pyb. Furthermore, the spherical surface Si of a radius 1 about the image point Ai is established, the coordinates at which the light going through the point Pxu and reaching the image point Ai crosses the spherical surface Si are (Xixu, Yixu), the coordinates at which the light going through the point Pxb and reaching the image point Ai crosses the spherical surface Si are (Xixb, Yixb), the coordinates at which the light going through the point Pyu and reaching the image point Ai crosses the spherical surface Si are (Xiyi, Yiyu), and the coordinates at which the light going through the point Pyb and reaching the image point Ai crosses the spherical surface Si are (Xiyb, Yiyb). Here, the directions of the X and Y axes in the aperture portion are defined so that the symbols of the X, Y coordinates in the spherical surface Si matches the symbols of the X, Y coordinates in the aperture portion.

Then, as two variables corresponding to the image point Ai, variables NAxi and NAyi are introduced, which are defined by the following equations (9) and (10), respectively.

$$NAxi = (Xixu - Xixb)/2 \qquad (9)$$

$$NAyi = (Yiyu - Yiyb)/2 \qquad (10)$$

Thus, in order to make the numerical aperture of the light reaching each point on the arc-shaped imaging region ER on the image plane substantially uniform regardless of the direction, it is preferable that a predetermined shape of the aperture portion of the aperture stop AS substantially satisfies the following equation (11). In equation (11), $\Sigma(i=1\sim n)$ is the summation of i=1 to i=n.

$$\{\Sigma NAxi(i=1\sim n)\}/n = \{\Sigma NAyi(i=1\sim n)\}/n \qquad (11)$$

With reference to Tables (2) and (3), as described before, in the projection optical system PL shown in FIG. 6, in a conventional example according to conventional technology, the aperture portion of the aperture stop AS has a round shape in which the diameter φ=68.348 mm. In this embodiment of this invention, the aperture portion of the aperture stop AS has an elliptical shape in which an X direction diameter φx=66.764 mm, and a Y direction diameter φy=68.348 mm. Hereafter, an evaluation example is shown, focusing on only six image points A1 through A6, but this is to simplify the description. It is inherently preferable that many more image points are sampled on the arc-shaped imaging region ER of the image plane. The following Table (5) shows the coordinates (X coordinate, Y coordinate) of six image points A1 through A6 shown in FIG. 11(a).

TABLE (5)

A1 = (0, 29)
A2 = (0, 31)
A3 = (13, 26.037)
A4 = (13, 28.037)
A5 = (−13, 26.037)
A6 = (−13, 26.037)

Therefore, in the case of a conventional example, the following Table (6) shows the coordinates in which the light reaching the respective image points A1 through A6 crosses the spherical surface Si, that is Xixu, Xixb, Yiyu, Yiyb.

TABLE (6)

X1xu = 0.258042943154
X1xb = −0.258042943154
Y1yu = 0.256357547338
Y1yb = −0.245172818845
X2xu = 0.257476143154
X2xb = −0.257476143154
Y2yu = 0.255819520205
Y2yb = −0.242616331396
X3xu = 0.259312007332
X3xb = −0.253769989674
Y3yu = 0.257306651069
Y3yb = −0.246969026605
X4xu = 0.259077265506
X4xb = −0.252997085452
Y4yu = 0.256801648512
Y4yb = −0.244661464593
X5xu = 0.253769989674
X5xb = −0.259312007332
Y5yu = 0.257306651069
Y5yb = −0.246969026606
X6xu = 0.252997085391
X6xb = −0.259077265493
Y6yu = 0.256801650789
Y6yb = −0.244661462094

Meanwhile, in the case of this embodiment, the following Table (7) shows the coordinates in which the light reaching the respective image points A1 through A6 crosses the spherical surface Si, that is, Xixu, Xixb, Yiyu, Yiyb.

TABLE (7)

X1xu = 0.252165810353
X1xb = −0.252165810353
Y1yu = 0.256357547323
Y1yb = −0.245172893708
X2xu = 0.25161071214
X2xb = −0.25161071214
Y2yu = 0.255819520205
Y2yb = −0.242616146657
X3xu = 0.253346326274
X3xb = −0.248029134343
Y3yu = 0.257306648643
Y3yb = −0.246967652147

TABLE (7)-continued

X4xu = 0.253123286675
X4xb = −0.247265493391
Y4yu = 0.256801637468
Y4yb = −0.244660091297
X5xu = 0.248029134344
X5xb = −0.253346326274
Y5yu = 0.257306648643
Y5yb = −0.246967652148
X6xu = 0.24726549333
X6xb = −0.253123286663
Y6yu = 0.256801639745
Y6yb = −0.244660088798

Thus, in the case of a conventional example, the following Table (8) shows {ΣNAxi(i=1~n)}/n and {ΣNAyi(i=1~n)}/n of equation (11). Furthermore, in the case of this embodiment, the following Table (9) shows {ΣNAxi (i=1~n)}/n and {ΣNAyi (i=1~n)}/n of equation (11).

TABLE (8)

{Σ NAxi (i = 1~n)}/n = 0.256779239
{Σ NAyi (i = 1~n)}/n = 0.2509536499

TABLE (9)

{Σ NAxi (i = 1~n)}/n = 0.2509234605
{Σ NAyi (i = 1~n)}/n = 0.2509531806

In Tables (8) and (9), it is clear that this embodiment satisfies equation (11) more preferably than a conventional example. As a result, in this embodiment according to this invention, a predetermined shape of the aperture portion of the aperture stop AS is set in an elliptical shape so as to substantially satisfy equation (11). Thus, the numerical aperture of the light reaching each point on the arc-shaped imaging region ER on the image plane can be substantially uniform regardless of the direction.

Incidentally, in a projection optical system mounted to a semiconductor pattern exposure apparatus, as an aperture stop, in the same manner as, for example, a camera stop, an iris diaphragm is normally used in which an aperture diameter is variable. However, in this embodiment, for example, when a deformed aperture portion such as an elliptical-shaped aperture portion is used, an iris diaphragm cannot be used as an aperture stop. Therefore, in this embodiment, when the numerical aperture NA of the projection optical system PL changes, it is desirable that a structure is used which can be replaced with another aperture stop in a different aperture shape. Furthermore, the other aperture stop in a different aperture shape can instead be an aperture stop in a similar shape.

In addition, in FIG. 6, in general, in a reflective type projection optical system in which a field of view region and an imaging region are formed spaced from an optical axis, an aperture stop is arranged in an extremely narrow space so that an effective light beam is not blocked. Additionally, when an ordinary aperture stop with a round-shaped aperture portion is used as well, instead of having a relatively complex mechanism in an aperture stop for the purpose of varying the aperture diameter, it is sometimes desirable that a structure is used that can be replaced with another aperture stop in a different aperture shape. Furthermore, in the above-mentioned embodiments, a reflective type projection optical system is used, but the invention is not limited to this, and the same operation effect as described in the above-mentioned embodiments can be obtained using a catadioptric projection optical system.

In the exposure apparatus of the above-described embodiments, it is possible to manufacture microdevices (semiconductor elements, image pickup devices, liquid crystal display devices, thin film magnetic heads, or the like) by illuminating (an illumination step) a mask by an illumination system, and exposing (an exposure step) a pattern for transfer formed on the mask onto a photosensitive substrate, using a projection optical system. With reference to the flowchart of FIG. 12, the following explains an example of a method of forming a predetermined circuit pattern on a wafer or the like as a photosensitive substrate, using the exposure device in the embodiments, when a semiconductor device is obtained as a microdevice.

Figure 12:
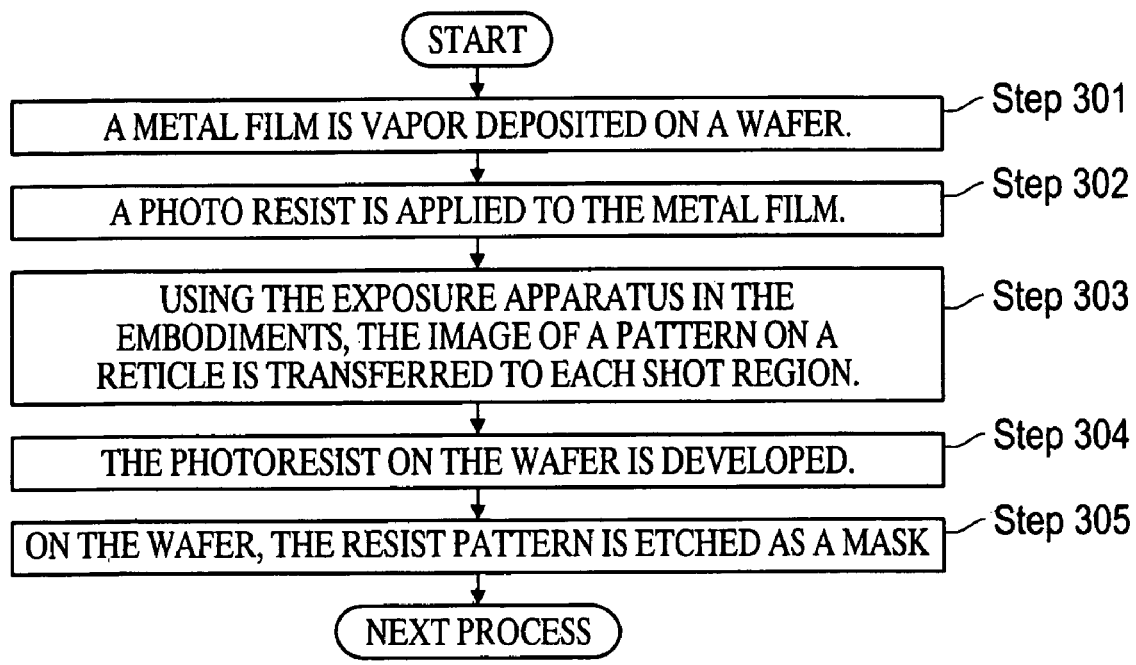
FIG. 12 is a diagram showing a flowchart with respect to one example of a method of obtaining a semiconductor device as a microdevice.

First, in step 301 of FIG. 12, a metal film is vapor deposited on one lot of wafers. Next, in step 302, a photoresist is applied to the metal film of the lot of wafers. After that, in step 303, using the exposure apparatus in the embodiments, the image of a pattern on a mask (reticle) is successively exposure transferred onto each shot region of the lot of wafers via the projection optical system.

After that, in step 304, after the photoresist on the lot of wafers is developed, the circuit pattern corresponding to the pattern on the mask is formed on each shot region on each wafer by etching, in step 305, the resist pattern serving as a mask on the lot of wafers. After that, a device such as a semiconductor element or the like is manufactured by performing circuit pattern formation or the like on successive layers. According to the above-described semiconductor device manufacturing method, it is possible to obtain, with good throughput, a semiconductor device having a very detailed circuit pattern.

Additionally, in the above-described exemplary embodiments, a laser plasma light source is used as a light source for providing EUV light. However, this invention is not limited to this, and other appropriate light sources for providing EUV light, for example, a synchrotron radiation (SOR) light source also can be used.

Furthermore, in the above-described embodiments, this invention is applied to an exposure apparatus that has a light source for providing EUV light (X rays). However, this invention is not limited to this, and this invention also can be applied to an exposure apparatus that has a light source that provides other wavelength light, other than EUV light.

In addition, in the above-described embodiments, this invention is applied to a projection optical system of the exposure apparatus. However, this invention is not limited to this, and this invention also can be applied to general reflective type projection optical systems in which an image of a first plane (object plane) is formed in a predetermined region spaced from an optical axis at a second plane (image plane).

What is claimed is:

1. A reflective projection optical system by which an image of a first plane is formed at a second plane in a predetermined region spaced from an optical axis, comprising:

an aperture stop for defining a numerical aperture of the projection optical system, wherein the aperture stop is provided with an aperture portion in which dimensions in two directions perpendicular to each other are different from each other, and wherein:

when a plurality of image points on the predetermined region at the second plane are A1, A2, A3, . . . , An; the plurality of image points are sampled a plurality of times at substantially the same interval on the predetermined region at the second plane; an arbitrary one among the plurality of image points is Ai; two coordinate axes x, y perpendicular to each other on a plane parallel to a plane including the aperture stop are assumed; on the aperture stop periphery, a point at which the coordinate x is at a maximum is Pxu, a point at which the coordinate x is at a minimum is Pxb, a point at which the coordinate y is at a maximum is Pyu, and a point at which the coordinate y is at a minimum is Pyb; a spherical surface Si of a radius 1 about the image point Ad is assumed; coordinates at which light passing through the point Pxu and reaching the image point Ad crosses the spherical surface Si are (Xixu, Yixu); coordinates at which light passing through the point Pxb and reaching the image point Ai crosses the spherical surface Si are (Xixb, Yixb); coordinates at which light passing through the point Pyu and reaching the image point Ai crosses the spherical surface Si are (Xiyu, Yiyu); coordinates at which light passing through the point Pyb and reaching the image point Ai crosses the spherical surface Si are (Xiyb, Yiyb); and two variables NAxi and NAyi corresponding to the image point Ai are established, respectively, as follows:

$$NAxi=(Xixu-Xixb)/2$$

$$NAyi=(Yiyu-Yiyb)/2,$$

a predetermined shape of the aperture portion substantially satisfies $\{\Sigma NAxi\ (i=1\sim n)\}/n=\{\Sigma NAyi\ (i=1\sim n)\}/n$.

2. A reflective projection optical system by which an image of a first plane is formed at a second plane in a predetermined region spaced from an optical axis, comprising:

an aperture stop for defining a numerical aperture of the projection optical system, wherein the aperture stop is provided with an aperture portion in which dimensions in two directions perpendicular to each other are different from each other, and wherein:

the predetermined shape of the aperture portion is defined so as to compensate for the effect of non-uniformity of the numerical aperture of the light reaching each point within the predetermined region due to a partial optical system arranged between the aperture stop and the second surface not satisfying a desired projective relationship.

3. The projection optical system as set forth in claim 2, wherein:

if an angle in which a principal ray passing through the aperture stop forms with an optical axis is θ, a distance from the optical axis to a point in which the principal ray reaches the second surface is h, a focal length of the partial optical system is F, and a projective relationship of the partial optical system is defined by h=F·g (θ) by using a function g (θ) in which θ is a variable, the predetermined shape of the aperture portion is an elliptical shape such that a ratio of long and short diameters is tan θ: g (θ)/(d g (θ)/d θ).

4. The projection optical system as set forth in claim 2, wherein:

the predetermined shape of the aperture portion is substantially an elliptical shape.

5. The projection optical system as set forth in claim 2, wherein:

the predetermined shape of the aperture portion is an elliptical shape having a long diameter in a meridional direction.

6. The projection optical system as set forth in claim 2, wherein:

the aperture stop is constituted so as to be replaceable with another aperture stop having a different aperture shape.

7. An exposure apparatus, comprising:

an illumination system for illuminating a mask set at a first plane; and the projection optical system as set forth in claim 2 for forming an image of a pattern formed on the mask onto a photosensitive substrate set at the second plane.

8. The exposure apparatus as set forth in claim 7, wherein:

the illumination system is provided with a light source for providing EUV light as exposure light; and the mask and the photosensitive substrate are moved relative to the projection optical system, and a pattern of the mask is projected and exposed onto the photosensitive substrate.

9. An exposure method, comprising the steps of:

illuminating a mask set at a first plane; and projecting and exposing an image of a pattern formed on the mask onto a photosensitive substrate set at a second plane via the projection optical system as set forth in claim 2.

10. The projection optical system as set forth in claim 2, wherein:

when a plurality of image points on the predetermined region at the second plane are A1, A2, A3, . . . , An; the plurality of image points are sampled a plurality of times at substantially the same interval on the predetermined region at the second plane; an arbitrary one among the plurality of image points is Ai; two coordinate axes x, y perpendicular to each other on a plane parallel to a plane including the aperture stop are assumed; on the aperture stop periphery, a point at which the coordinate x is at a maximum is Pxu, a point at which the coordinate x is at a minimum is Pxb, a point at which the coordinate y is at a maximum is Pyu, and a point at which the coordinate y is at a minimum is Pyb; a spherical surface Si of a radius 1 about the image point Ai is assumed; coordinates at which light passing through the point Pxu and reaching the image point Ai crosses the spherical surface Si are (Xixu, Yixu); coordinates at which light passing through the point Pxb and reaching the image point Ai crosses the spherical surface Si are (Xixb, Yixb); coordinates at which light passing through the point Pyu and reaching the image point Ai crosses the spherical surface Si are (Xiyu, Yiyu); coordinates at which light passing through the point Pyb and reaching the image point Ai crosses the spherical surface Si are (Xiyb, Yiyb); and two variables NAxi and NAyi corresponding to the image point Ai are established, respectively, as follows:

$$NAxi=(Xixu-Xixb)/2$$

$$NAyi=(Yiyu-Yiyb)/2,$$

a predetermined shape of the aperture portion substantially satisfies $\{\Sigma NAxi(i=1\sim n)\}/n=\{\Sigma NAyi\ (i=1n)\}/n$.

11. A reflective projection optical system by which an image of a first plane is formed at a second plane in a predetermined region spaced from an optical axis, comprising:

an aperture stop for defining a numerical aperture of the projection optical system, wherein the aperture stop is provided with an aperture portion in which dimensions in two directions perpendicular to each other are different from each other, and wherein:

the predetermined shape of the aperture portion is defined so as to compensate for the effect of non-uniformity of the numerical aperture of the light reaching each point within the predetermined region due to the partial optical system arranged between the aperture stop and the second surface not satisfying a sine condition.

12. The projection optical system as set forth in claim 11, wherein:

when a plurality of image points on the predetermined region at the second plane are A1, A2, A3, . . . , An; the plurality of image points are sampled a plurality of times at substantially the same interval on the predetermined region at the second plane; an arbitrary one among the plurality of image points is Ai; two coordinate axes x, y perpendicular to each other on a plane parallel to a plane including the aperture stop are assumed; on the aperture stop periphery, a point at which the coordinate x is at a maximum is Pxu, a point at which the coordinate x is at a minimum is Pxb, a point at which the coordinate y is at a maximum is Pyu, and a point at which the coordinate y is at a minimum is Pyb; a spherical surface Si of a radius 1 about the image point Ai is assumed; coordinates at which light passing through the point Pxu and reaching the image point Ai crosses the spherical surface Si are (Xixu, Yixu); coordinates at which light passing through the point Pxb and reaching the image point Ai crosses the spherical surface Si are (Xixb, Yixb); coordinates at which light passing through the point Pyu and reaching the image point Ai crosses the spherical surface Si are (Xiyu, Yiyu); coordinates at which light passing through the point Pyb and reaching the image point Ai crosses the spherical surface Si are (Xiyb, Yiyb); and two variables NAxi and NAyi corresponding to the image point Ai are established, respectively, as follows:

$$NAxi = (Xixu - Xixb)/2$$

$$NAyi = (Yiyu - Yiyb)/2,$$

a predetermined shape of the aperture portion substantially satisfies $\{\Sigma NAxi\ (i=1\sim n)\}/n = \{\Sigma NAyi\ (i=1\sim n)\}/n$.

13. The projection optical system as set forth in claim 11, wherein:

the predetermined shape of the aperture portion is substantially an elliptical shape.

14. The projection optical system as set forth in claim 11, wherein:

the predetermined shape of the aperture portion is an elliptical shape having a long diameter in a meridional direction.

15. The projection optical system as set forth in claim 11, wherein:

the aperture stop is constituted so as to be replaceable with another aperture stop having a different aperture shape.

16. An exposure apparatus, comprising:

an illumination system for illuminating a mask set at a first plane; and the projection optical system as set forth in claim 11 for forming an image of a pattern formed on the mask onto a photosensitive substrate set at the second plane.

17. The exposure apparatus as set forth in claim 16, wherein:

the illumination system is provided with a light source for providing EVU light as exposure light; and the mask and the photosensitive substrate are moved relative to the projection optical system, and a pattern of the mask is projected and exposed onto the photosensitive substrate.

18. An exposure method, comprising the steps of:

illuminating a mask set at a first plane; and projecting and exposing an image of a pattern formed on the mask onto a photosensitive substrate set at a second plane via the projection optical system as set forth in claim 11.

* * * * *